(12) United States Patent
Karlquist

(10) Patent No.: US 6,765,435 B2
(45) Date of Patent: Jul. 20, 2004

(54) PHASE LOCKED LOOP DEMODULATOR AND DEMODULATION METHOD USING FEED-FORWARD TRACKING ERROR COMPENSATION

(75) Inventor: Richard K. Karlquist, Cupertino, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/328,363

(22) Filed: Dec. 23, 2002

(65) Prior Publication Data

US 2004/0119548 A1 Jun. 24, 2004

(51) Int. Cl.[7] .............................................. H03D 3/24
(52) U.S. Cl. ...................... 329/345; 329/325; 375/376
(58) Field of Search ................................ 329/345, 315, 329/319, 320, 325; 375/327, 376; 327/158; 455/214, 337, 260

(56) References Cited

U.S. PATENT DOCUMENTS

| | | | |
|---|---|---|---|
| 3,854,098 A | * 12/1974 | Takahashi et al. | .......... 329/326 |
| 3,906,380 A | * 9/1975 | Querry | ........................ 329/307 |
| 5,949,281 A | * 9/1999 | Sharpe | ........................ 329/325 |
| 6,002,298 A | * 12/1999 | Noga | ........................ 329/300 |

OTHER PUBLICATIONS

U.S. patent application Ser. No. 10/328,404, Karlquist.
U.S. patent application Ser. No. 10/328,298, Karlquist.
U.S. patent application Ser. No. 10/328,358, Karlquist.
Armstrong, Edwin H, "A Method of Reducing Disturbances in Radio Signaling by a System of Frequency Modulation", Proc. IRE, vol. 24, No. 5, May 1936, p. 689ff.
Jaffe, D.L., "Armstrong's Frequency Modulator", Proc. IRE, vol. 26, No. 4, Apr. 1938, p. 475ff.

* cited by examiner

*Primary Examiner*—Robert Pascal
*Assistant Examiner*—Joseph Chang

(57) ABSTRACT

In embodiment, the present invention is directed to a PLL phase demodulator that utilizes feed-forward error correction. The feed-forward error correction may occur by calibrating an equalizer to possess transfer function that emulates the modulation response curve of the VCO of the PLL phase demodulator. In operation, the equalizer may receive the filtered and integrated version of the error signal produced by the phase detector of the PLL. The equalizer filters the received signal according to the calibrated transfer function. The output of the equalized is provided to a adder to combine the equalized signal with the error signal produced by the phase detector. A similar arrangement including a suitably calibrated equalizer may be utilized to address phase tracking error in a PLL frequency demodulator.

20 Claims, 8 Drawing Sheets

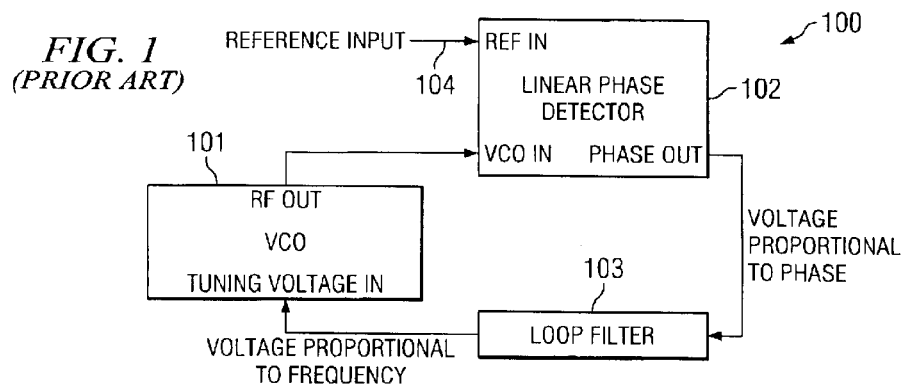
FIG. 1
(PRIOR ART)
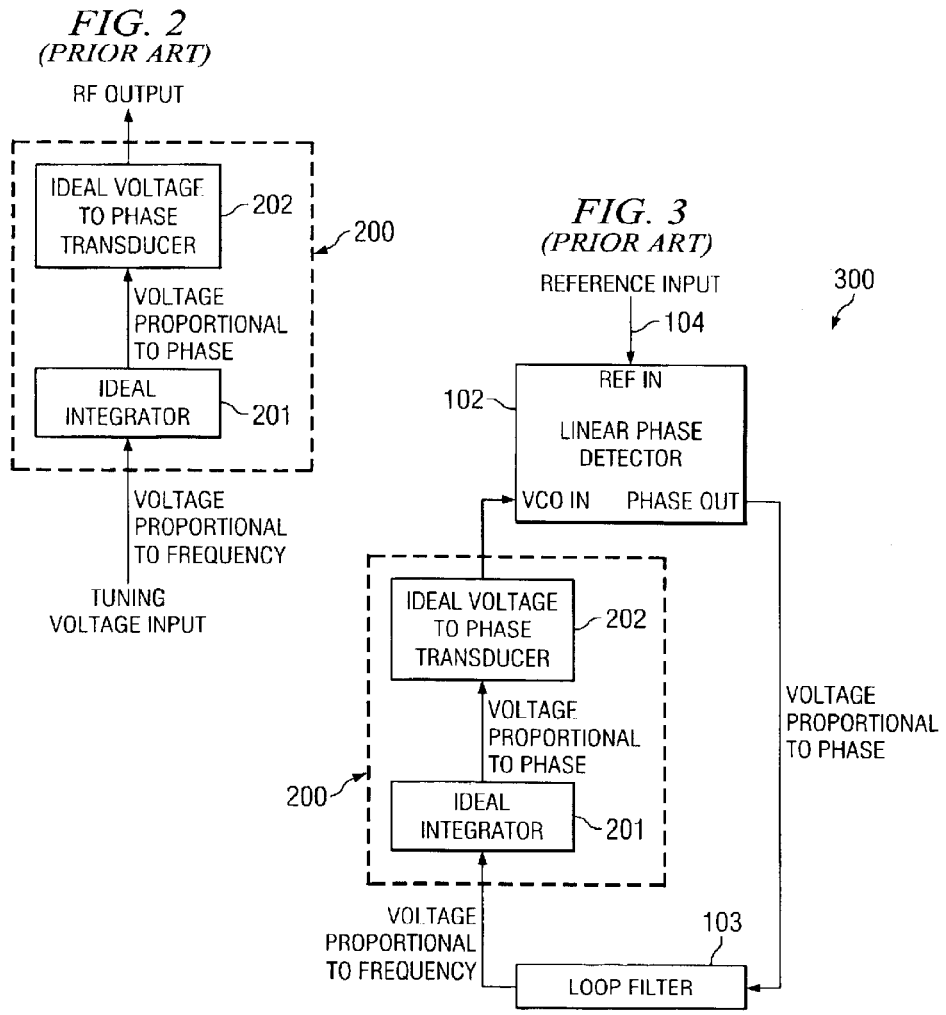
FIG. 2
(PRIOR ART)
FIG. 3
(PRIOR ART)

PHASE LOCKED LOOP DEMODULATOR AND DEMODULATION METHOD USING FEED-FORWARD TRACKING ERROR COMPENSATION

RELATED APPLICATIONS

The present application is related to concurrently filed, co-pending, and commonly assigned U.S. patent application Ser. No. 10/328,298, entitled "SYSTEMS AND METHODS FOR CORRECTING GAIN ERROR DUE TO TRANSITION DENSITY VARIATION IN CLOCK RECOVERY SYSTEMS;" U.S. patent application Ser. No. 10/328,304, entitled "SYSTEM AND METHOD FOR DESIGNING AND USING ANALOG CIRCUITS OPERATING IN THE MODULATION DOMAIN;" and U.S. patent application Ser. No. 10/328,358, entitled "SYSTEMS AND METHODS FOR CORRECTING PHASE LOCKED LOOP TRACKING ERROR USING FEED-FORWARD PHASE MODULATION;" the disclosures of which are hereby incorporated herein by reference.

TECHNICAL FIELD

The present invention is generally related to phase lock loop (PLL) demodulators and more particularly to systems and methods for utilizing feed-forward tracking error compensation to address tracking error in a PLL demodulator.

BACKGROUND OF THE INVENTION

Phase locked loops (PLLs) are devices that generate a signal and that lock their phase to the phase of an input reference signal. According to the prior art, as shown in FIG. 1, PLL 100 typically has three main components: voltage-controlled oscillator (VCO) 101, phase detector 102, and loop filter 103. VCO 101 generates a signal that has a frequency proportional to the tuning voltage input. This proportionality is typically expressed as a VCO gain parameter ($K_v$) denoted in units of radians/second per volt. Reference signal 104 may be provided at a reference frequency and phase. Phase detector 102 generates an output voltage proportional to the phase difference between the reference signal and the VCO signal. This proportionality is typically expressed as a phase detection gain parameter ($K_d$) denoted in units of volts/radian. Thus, phase detector 102 generates a phase error signal (i.e., the phase tracking error). Loop filter 103 amplifies and filters this error signal, which is then fed back to VCO 101. This feedback adjusts the phase of VCO 101 and causes VCO 101 to approximate the phase of the reference signal thereby minimizing the error.

PLL 100 as shown in FIG. 1 is difficult to analyze on a mathematical basis, because the input and output of the loop filter are different types of variables (i.e., voltage proportional to phase and voltage proportional to frequency, respectively). By definition, phase is the time integral of frequency. Therefore, an ideal VCO 200 may be modeled as two mathematical blocks: ideal integrator 201 and ideal voltage to phase transducer 202 as shown in FIG. 2 according to the prior art. Ideal VCO 200 may be incorporated in a PLL system to provide useable PLL model 300 as shown in FIG. 3 according to the prior art. PLL model 300 may then be analyzed according to mathematical model 400 shown in FIG. 4 according to the prior art. In mathematical model 400, $K_d$ represents the phase detection gain parameter of phase detector 102, F(s) represents the transfer function of loop filter 103 (expressed in Laplace transform notation), 1/s represents the transfer function of ideal integrator 201 (also expressed in Laplace transform notation), and $K_v$ represents the VCO gain parameter of VCO 101. The loop gain is represented by the parameter G which equals $K_d K_v F(s)/s$. Moreover, $\theta_{vco}$ represents the phase of the signal produced by VCO 101 and $\theta_{ref}$ represents the phase of the reference signal. The relationship between $\theta_{vco}$ and $\theta_{ref}$ may be represented by the following equation: $\theta_{vco}/\theta_{ref} = G/(1+G)$. Thus, when the loop gain is relatively large (G >>1), $\theta_{vco}$ approximates $\theta_{ref}$ with a significant degree of accuracy.

Integrator 201 acts as a low pass filter and causes the loop gain to decrease with increasing frequency. Thus, tracking error increases with increasing frequency. At some frequency, the loop gain falls below unity. Above this frequency (which defines the loop bandwidth), the loop has relatively little response to the reference stimulus and, hence, limits the capacity of PLL 100 to continue accurately tracking the reference signal. Accordingly, this places a constraint upon the bandwidth of modulation that may be applied to the reference signal. Theoretically, the loop bandwidth can be increased by increasing the loop gain. However, in practice, implementations of VCO 101 have finite modulation bandwidth. The limited bandwidth of VCO 101 may be modeled in VCO 500 as a parasitic low pass filter 501 defined by transfer function P(s) as shown in FIG. 5 according to the prior art. This has the effect of modifying the mathematical model by adding another low pass function to loop model 600 as shown in FIG. 6 according to the prior art. As shown in FIG. 6, the loop gain (G) equals $K_d K_v F(s) P(s)/s$. This has the practical effect of limiting the loop bandwidth to a relatively small fraction of the VCO bandwidth. Because of numerous design constraints associated with implementations of VCO 101, the VCO bandwidth cannot be made arbitrarily high. Accordingly, the VCO bandwidth often becomes a limiting factor on loop bandwidth. In addition to the VCO bandwidth, the loop filter may have its own bandwidth limitations, especially if it utilizes active circuitry. The effect of finite loop filter bandwidth is the same as VCO bandwidth in terms of limiting loop bandwidth.

PLLs are commonly utilized to build frequency or phase demodulators. A demodulator is a system driven by a modulated signal that produces an output voltage that is proportional to the modulation. FIG. 7 depicts PLL frequency demodulator 700 according to the prior art. VCO 101 tracks the phase of the reference signal. Because of the close mathematical relationship between phase and frequency, VCO 101 also tracks the frequency of the reference. Since the tuning voltage applied to VCO 101 is proportional to the VCO frequency (and, hence, to the reference frequency), the tuning voltage is used directly as demodulated output 701.

FIG. 8 depicts phase demodulator 800 according to the prior art. Phase demodulator 800 is substantially the same as frequency demodulator 700 except that leaky integrator 801 has been added to convert the tuning voltage (proportional to frequency) into a voltage (demodulated output 802) proportional to phase. Since an ideal integrator is not physically realizable, a so-called "leaky" integrator 801 is shown, Specifically, leaky integrator 801 approximately acts as an ideal integrator above a specified minimum frequency ($\omega_1$). Below that frequency, leaky integrator 801 changes to a flat gain versus frequency characteristic. This imparts a low frequency cutoff to the frequency response of the demodulation output port.

BRIEF SUMMARY OF THE INVENTION

In an embodiment, the present invention is directed to a PLL phase demodulator that utilizes feed-forward error correction. The feed-forward error correction may occur by calibrating an equalizer to possess a transfer function that emulates the modulation response curve of the VCO of the PLL phase demodulator. In operation, the equalizer may receive the filtered and integrated version of the error signal produced by the phase detector of the PLL. The equalizer filters the received signal according to the calibrated transfer function. The output of the equalizer is provided to a adder to combine the equalized signal with the error signal produced by the phase detector. The combined signal represents the demodulated output signal. In other embodiments, a similarly calibrated equalizer may be utilized to address tracking error in a frequency demodulator. By utilizing a suitable calibrated equalizer, embodiments in accordance with the invention enable demodulators to operate at arbitrarily high modulation frequencies (for small modulation index) that are not limited by the loop bandwidth or VCO bandwidth.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which:

FIG. 1 depicts a PLL according to the prior art;

FIG. 2 depicts a conceptual model of a VCO according to the prior art;

FIG. 3 depicts PLL including the conceptual model of a VCO according to the prior art;

DETAILED DESCRIPTION OF THE INVENTION

One of the principal sources of inaccuracy in PLL demodulators is the phase tracking error. Phase tracking error may be minimized by increasing the loop bandwidth as much as possible. As previously noted, in practice, the loop components (namely, VCO 101) have parasitic frequency response impairments that place an upper bound on the achievable bandwidth. The usable bandwidth is, in turn, limited to a small fraction of the loop bandwidth if high accuracy (i.e., low phase tracking error) is desired. In any event, the demodulation bandwidth cannot exceed the loop bandwidth even for low accuracy applications. Accordingly, embodiments in accordance with the invention address these difficulties by providing an accurate, wideband response PLL demodulator that does not require an excessively high VCO modulation bandwidth.

Figure 4:
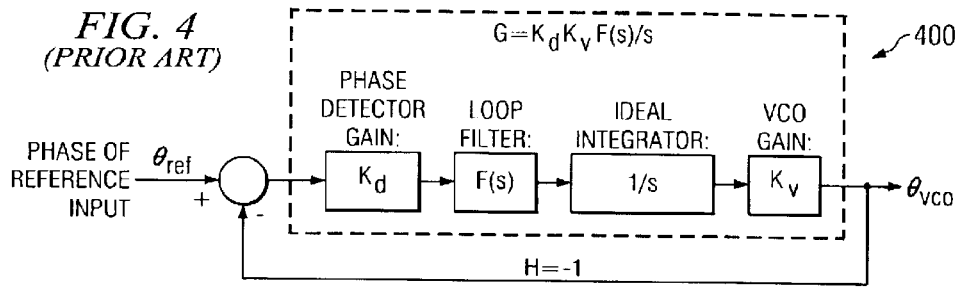
FIG. 4 depicts a mathematical model of a PLL according to the prior art.
Figure 5:
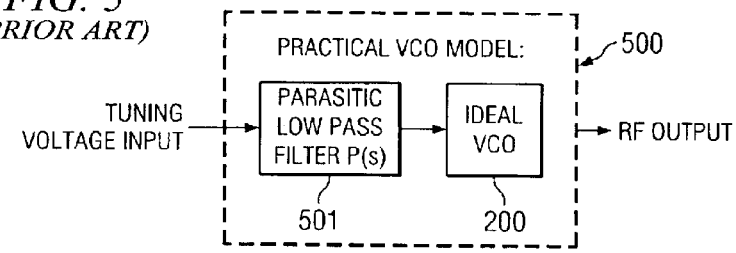
FIG. 5 depicts a practical VCO model according to the prior art.
Figure 6:
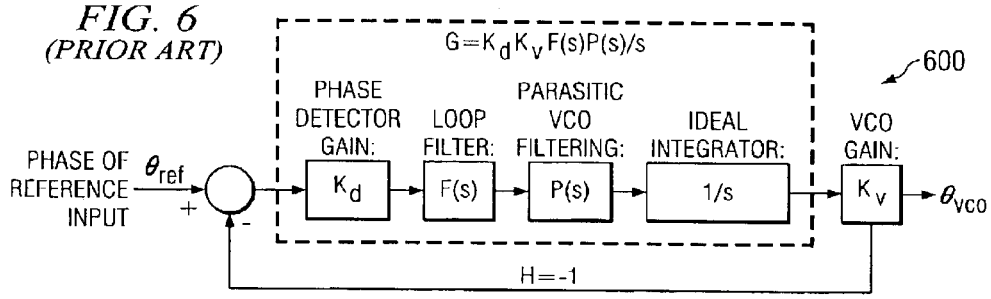
FIG. 6 depicts a mathematical model of a PLL that includes a practical VCO model according to the prior art.
Figure 7:
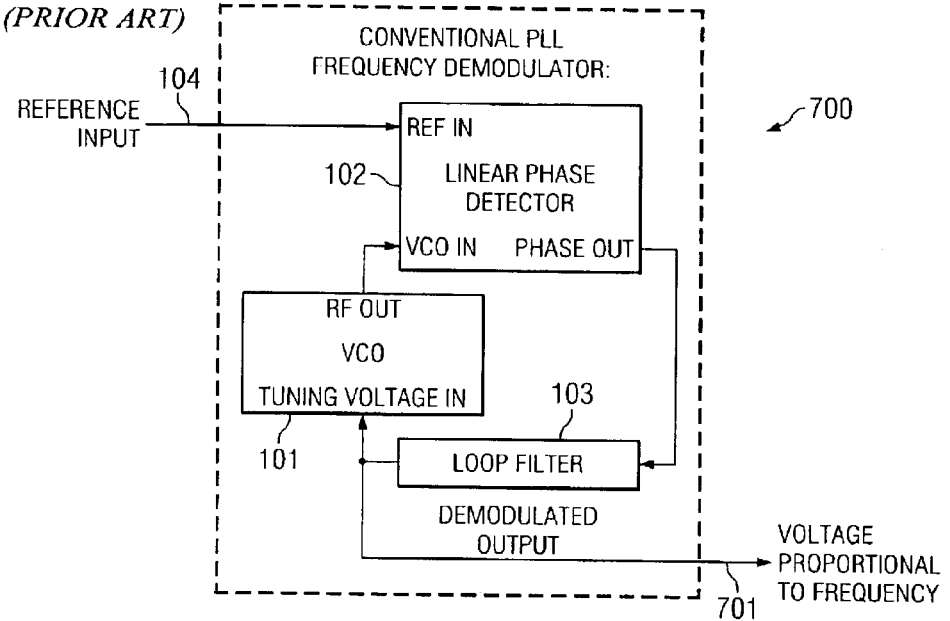
FIG. 7 depicts a conventional PLL frequency demodulator according to the prior art.
Figure 8:
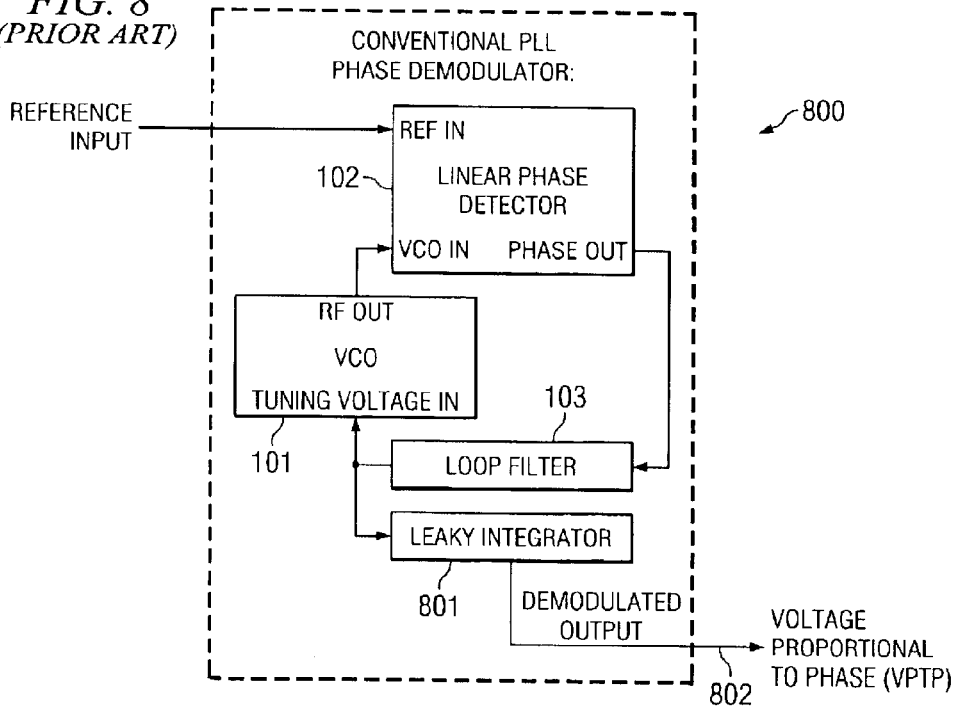
FIG. 8 depicts a conventional PLL phase demodulator according to the prior art.
Figure 9:
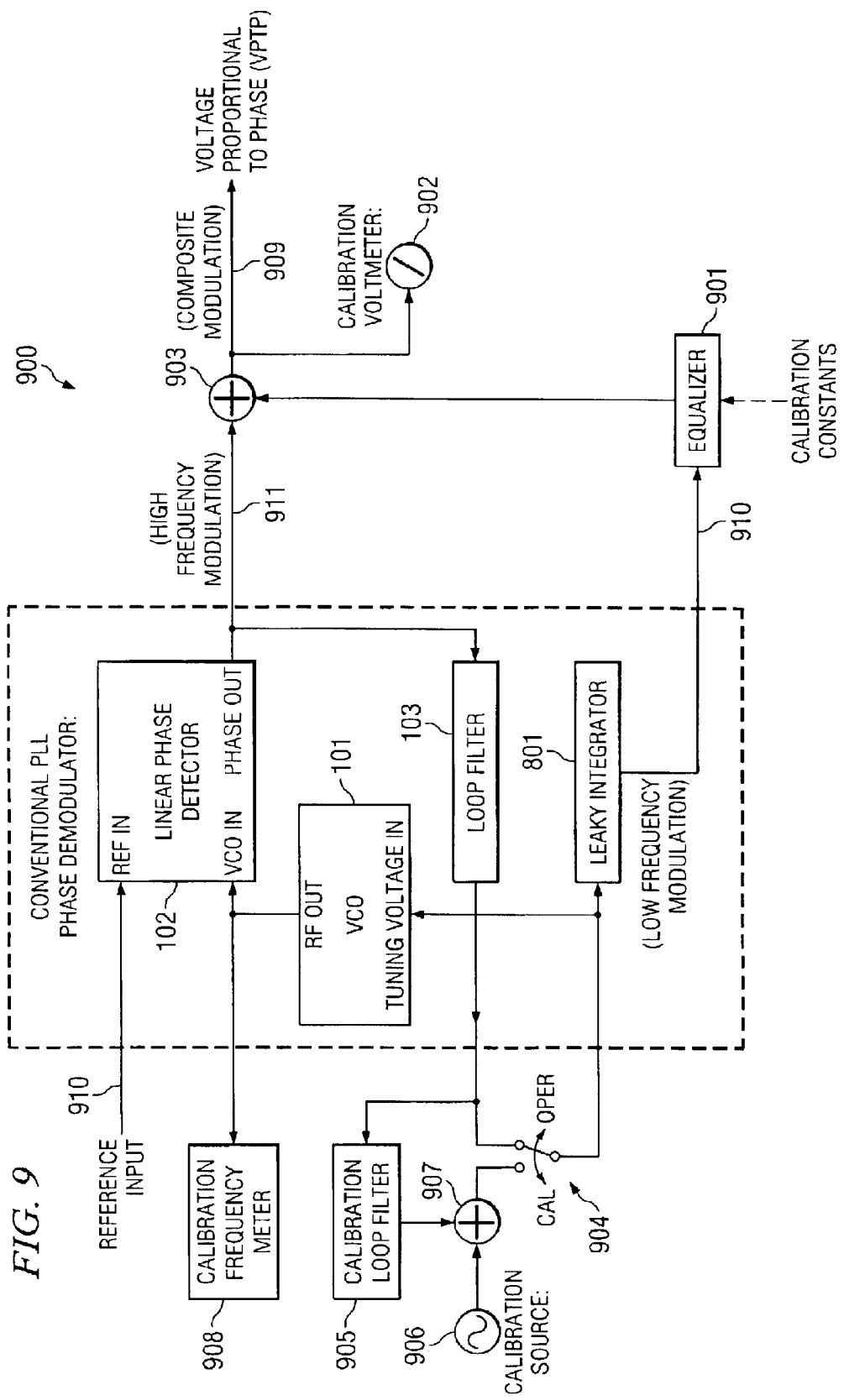
FIG. 9 depicts a PLL phase demodulator according to embodiments in accordance with the invention.

FIG. 9 depicts PLL phase demodulator 900 according to embodiments in accordance with the invention. PLL phase demodulator 900 comprises the typical main components of a phase demodulator: VCO 101, phase detector 102, loop filter 103, and leaky integrator 801. PLL phase demodulator 900 differs from conventional PLL phase demodulators by utilizing adder 903 in conjunction with equalizer 901. Equalizer 901 is operable to equalize the low frequency modulation signal received from leaky integrator 801 according to a transfer function that emulates the modulation response curve of VCO 101. The calibration filter constants associated with equalizer 901 may be adjusted according to the determined modulation responsive curve of VCO 101. PLL phase demodulator 900 further comprises adder 903 that produces output signal 909 (which is a voltage proportion to phase (VPTP)). Specifically, adder 903 adds the phase detector output to the equalized signal from equalizer 901 thereby canceling out demodulation error due to mistracking error. Moreover, summing these two signals enables PLL phase demodulator 900 to operate at arbitrarily high modulation frequencies (for small modulation index) that are not limited by the loop bandwidth or VCO bandwidth.

The operation of PLL phase demodulator 900 depends upon the frequency of the modulation originally applied to reference input signal 910 (i.e., the signal being demodulated). In essence, there are three regimes of operation. For low modulation frequencies (i.e., well within the loop bandwidth), the operation is substantially identical to operation of conventional PLL phase demodulators. In this regime, the loop tracking error is negligible and, hence, there is negligible output from phase detector 102. At these frequencies, the effect of equalizer 901 is to apply a scaling factor to signal 910. Specifically, signal 910 passes through equalizer 901 without appreciable modification except for scaling. For high modulation frequencies (i.e., well beyond the loop bandwidth), the loop has negligible response, and the phase of VCO 101 is approximately constant. This occurs; because the combination of loop filter 103, the modulation bandwidth of VCO 101, and the built-in integrator of VCO 101 causes severe high frequency attenuation. In this case, signal 910 is negligible and the tracking error is approximately 100%. In other words, the tracking error is equal and opposite to the modulation carried on reference input 910. Thus, phase detector 102 operates as a phase demodulator in its own right. In this case, the phase detector signal 911 passes through to output signal 909 without appreciable modification and equalizer 901 has little appreciable effect in the high frequency regime. For medium modulation frequencies, the operation is a combination of the two previously described modes. In the medium modulation frequency regime, equalizer 901 applies a scaling factor and a frequency response effect to cancel error due to phase mistracking.

Figure 10:
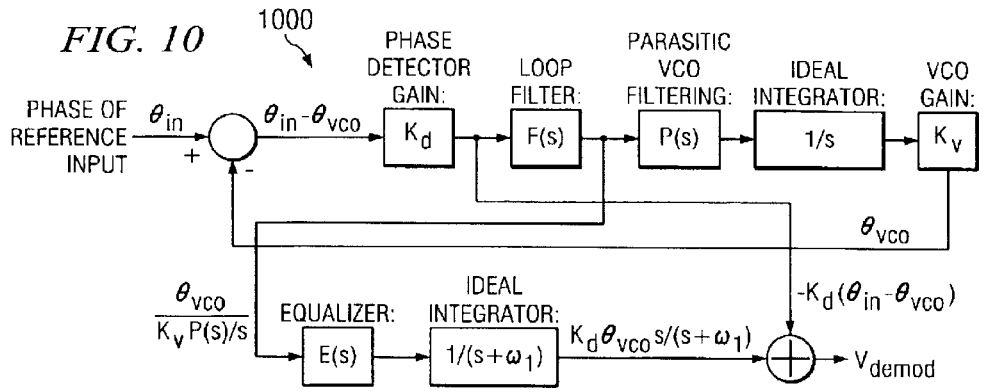
FIG. 10 depicts a mathematical model of the PLL phase demodulator shown in FIG. 9 according to embodiments in accordance with the invention.

FIG. 10 depicts mathematical model 1000 of PLL phase demodulator 900 according to embodiments in accordance with the invention. Mathematical model 1000 demonstrates the accuracy of PLL phase demodulator 900 at all frequencies above the cutoff frequency of leaky integrator 801. In mathematical model 1000, $\theta_{vco}$ represents the phase of the signal produced by VCO 101 and $\theta_{in}$ represents the phase of the reference signal. Also, $K_d$ represents the phase detection gain parameter of phase detector 102, F(s) represents the transfer function of loop filter 103, P(s) represents the transfer function of the parasitic low pass filter characteristic of VCO 101, 1/s represents the transfer function of ideal integrator 201, $K_v$ represents the VCO gain parameter of VCO 101, E(s) represents the transfer function of equalizer 901, and $1/(s+107_1)$ represents the transfer function of leaky integrator 801. According to embodiments in accordance with the invention, it may be advantageous to set the transfer function of E(s) to equal $K_d K_v P(s)$. The input to equalizer 901 (signal 910 of FIG. 9) is characterized by $\theta_{VCO}/K_v P(s)/s$. Thus, by setting E(s) in this manner, output signal 909 ($V_{demod}$) equals $K_d\{\theta_{VCO}[s/(s+\omega_1)-1]+\theta_{IN}\}$. If the frequency ($\omega$) of the modulation applied to reference input signal 910 is substantially greater than the specified minimum frequency of leaky integrator 801 (i.e., $\omega>>\omega_1$), then $V_{demod}$ very closely approximates $K_d\theta_{IN}$.

Returning now to FIG. 9, PLL phase demodulator 900 further comprises structure to facilitate calibration of equalizer 901. Specifically, PLL phase demodulator 900 comprises switch 904 to switch modes of operation between a demodulation mode and a calibration mode. When switch 904 places PLL phase demodulator 900 into the calibration mode, the output from loop filter 903 is diverted and sent to calibration loop filter 905 (which will be discussed in greater detail below). After calibration loop filter 905, the filtered signal is processed and provided to adder 907 where the filtered signal is added to the signal generated by calibration source 906. The combined signal then proceeds through the remaining circuit path through leaky integrator 801, equalizer 901, and adder 903. Calibration voltmeter 902 may be used to measure the voltage of output signal 909 during calibration. Also, calibration frequency meter 908 may be used to measure to frequency of VCO 101.

In embodiments in accordance with the invention, calibration may occur to determine the scale factor ($K_d$) of phase detector 102. Additionally, calibration may occur to set equalizer 901 to the appropriate DC gain and frequency response characteristics. In embodiments in accordance with the invention, a quasi open-loop calibration algorithm is utilized. To implement the quasi open-loop algorithm, calibration source 906 may advantageously generate DC signals and AC signals of frequencies included in the loop bandwidth. Likewise, an unmodulated frequency reference source (not shown) may be utilized to drive reference input signal 910. Preferably, the unmodulated frequency reference source may generate AC signals of frequencies over a small range centered on the frequency of the signal to be measured after calibration is complete.

In embodiments in accordance with the invention, the quasi open-loop calibration algorithm takes advantage of the fact that the accuracy of PLL phase demodulator 900 is independent of loop filter 103. Calibration is facilitated by the use of calibration loop filter 905 which acts as a low pass filter with a relatively low cutoff frequency. Adapting calibration loop filter 905 in this manner results in a narrow loop bandwidth. The loop can be considered open during the calibration mode due to the narrowed loop bandwidth. However, the loop is kept in lock for proper operation during the demodulation mode by utilizing switch 904 to bypass calibration loop filter 905.

Figure 11:
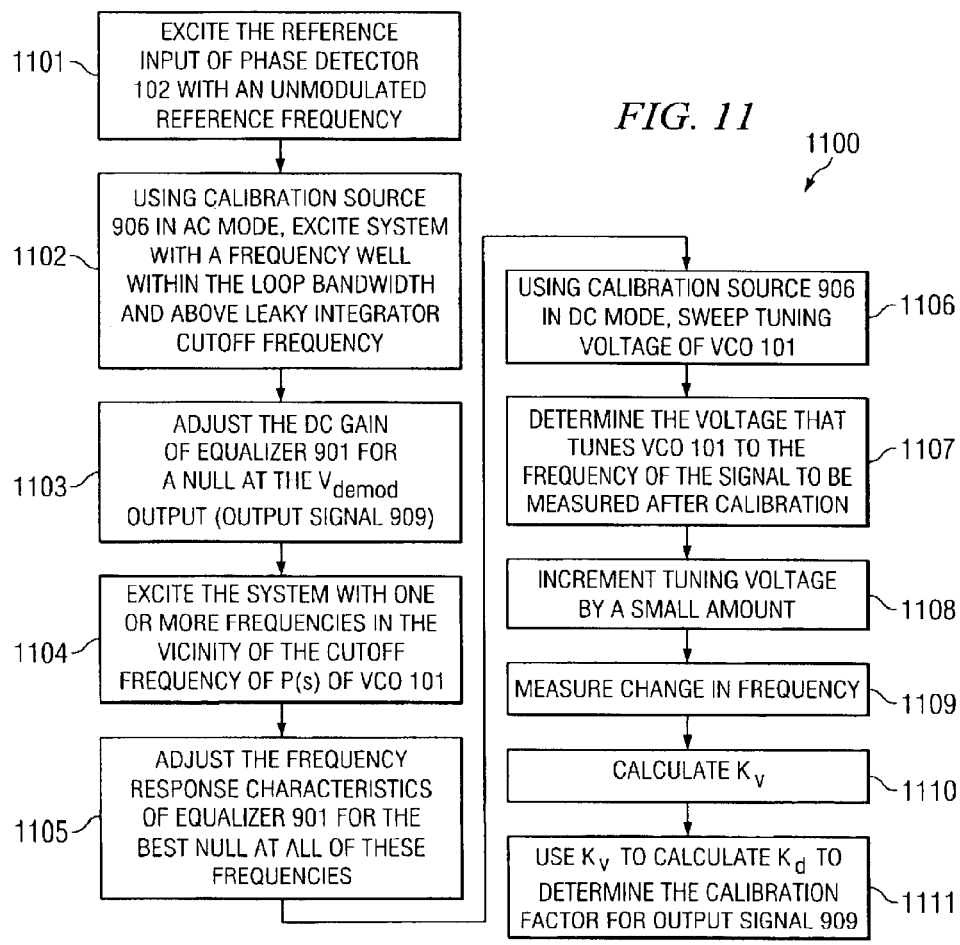
FIG. 11 depicts a flowchart for calibrating the PLL phase demodulator shown in FIG. 9 according to embodiments in accordance with the invention.

FIG. 11 depicts flowchart 1100 for calibrating PLL phase demodulator 900 according to embodiments in accordance with the invention. In step 1101, the reference input of phase detector 102 is excited with an unmodulated frequency signal. In step 1102, using calibration source 906 in AC mode, the system is excited with a frequency well within the loop bandwidth and above the cutoff frequency of leaky integrator 801. In step 1103, the DC gain of equalizer 901 is adjusted for a null at the $V_{demod}$ output (output signal 909 of FIG. 9). In step 1104, the system is excited with one or more frequencies in the vicinity of the cutoff frequency of P(s) associated with VCO 101. In practice, P(s) is typically a single pole function and, hence, only one frequency is generally required in step 1104. In step 1105, the frequency response characteristics of equalizer 901 are adjusted to achieve the best null for the frequencies applied to the system in step 1104. In step 1106, using calibration source 906 in DC mode, the tuning voltage applied to VCO 101 is swept across a range of values. The function of step 1107 is to determine the voltage that tunes VCO frequency to the frequency of the signal to be measured after calibration is complete. In step 1108, the tuning voltage is incremented from the determined voltage by a small amount. In step 1109, the change in the VCO frequency is measured. In step 1110, the VCO gain parameter ($K_v$) is calculated. In step 1111, the calculated value of $K_v$ is used to calculate the gain of phase detector 102 ($K_d$) and to, thereby, determine the calibration factor for output signal 909.

Figure 12:
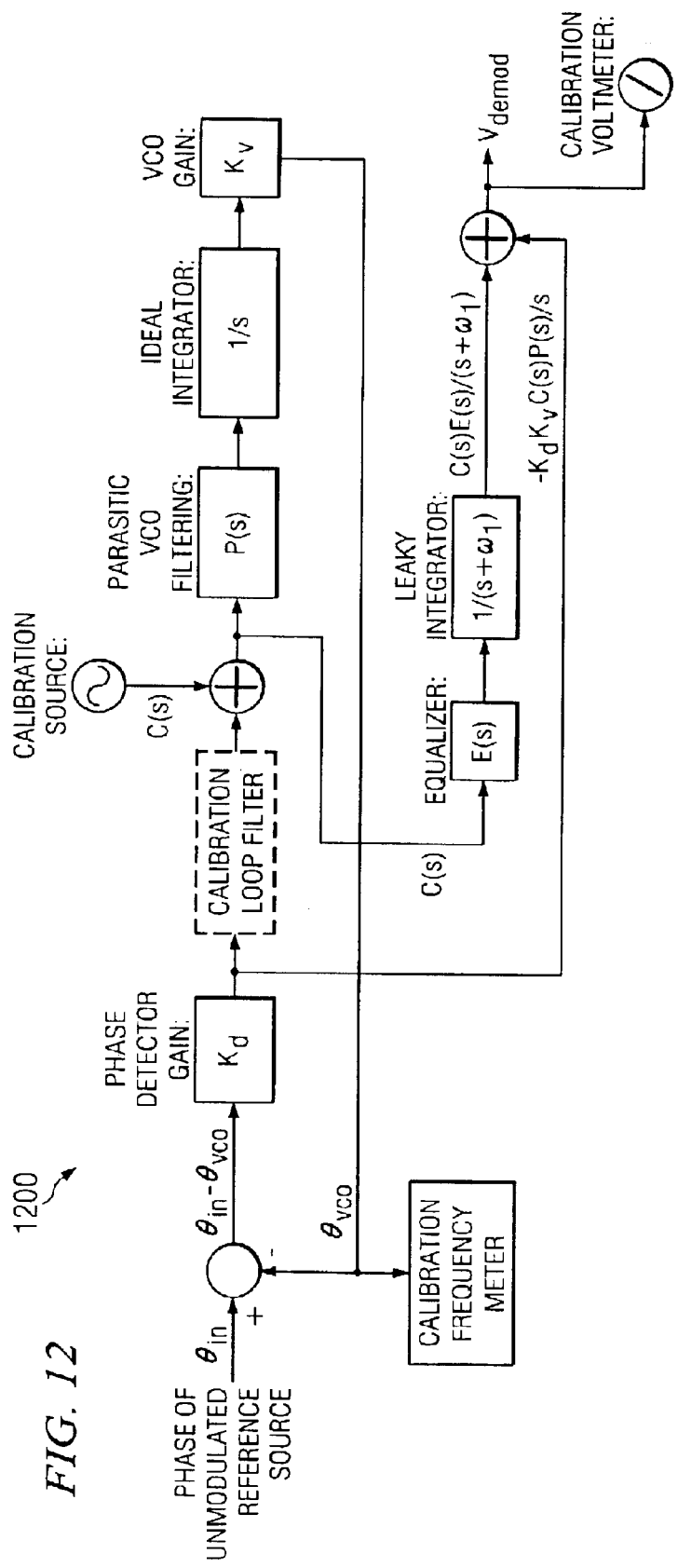
FIG. 12 depicts a mathematical analysis of calibration according to embodiments in accordance with the invention.

FIG. 12 depicts mathematical model 1200 that may be used to analyze the calibration algorithm described in connection with FIG. 11. It shall be appreciated that the effect of calibration loop filter 905 may be neglected from the mathematical analysis. As shown in FIG. 12, $K_v$ equals $\Delta f/\Delta C(0)$ where $\Delta f$ is the change in frequency of VCO frequency in response to the change in the DC value of the calibration source. Then, $K_v$ equals $E(0)/K_v$, because $P(0)=1$. By utilizing the relationship that if $V_{demod}=0$, then $E(s)=K_vK_vP(s)$, the frequency response requirements for E(s) may be determined by observing the nulls produced during the testing methodology discussed with respect to FIG. 11 (see output signal 909 of FIG. 9).

Phase detectors generally have a limited phase range (typically between 180 to 360 degrees). The amplitude of the modulation outside the loop bandwidth should be confined within this range. Modulation at frequencies within the loop bandwidth is not subject to this constraint. It shall be appreciated that many signals of interest have the characteristic that the phase modulation is large at low frequencies and tapers off at high frequencies. Thus, there are a relatively large number of applications that may utilize PLL demodulators according to embodiments in accordance with the invention.

Figure 13:
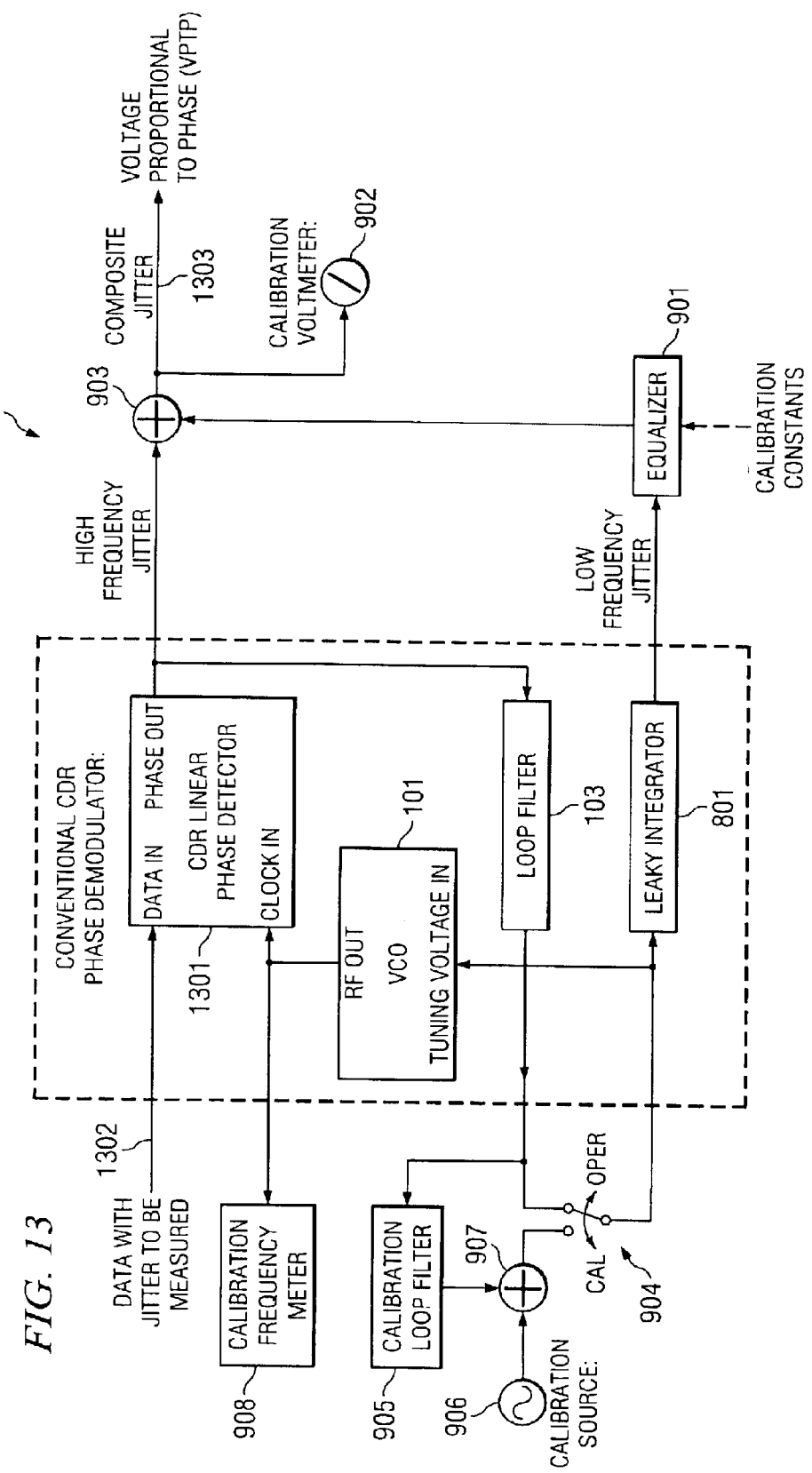
FIG. 13 depicts a clock data recovery phase demodulator according to embodiments in accordance with the invention.

For example, FIG. 13 depicts measurement system 1300 that may be used to measure jitter on data signal 1302 according to embodiments in accordance with the invention. Measurement system 1300 is substantially similar to PLL demodulator 900 of FIG. 9 except PLL demodulator 1300 comprises clock/data recovery (CDR) phase detector 1301 which is known in the art for recovering a clock from a data stream. Accordingly, CDR phase detector 1301 may be used to facilitate the measurement of jitter associated with the data. Adder 1301 of PLL demodulator 1300 combines high frequency jitter signal 1304 with the output of equalizer 901 to produce composite jitter signal 1303. Also, as known in the art, most data transmission systems are associated with jitter specifications that require allowable jitter above a specified frequency to be limited to a moderate value which is typically well within the range of phase detector 1301. By adapting PLL demodulator 1300 according to embodiments in accordance with the invention, the measurement of jitter by measurement system 1300 is assured of being accurate for high frequency jitter outside the PLL bandwidth.

Figure 14:
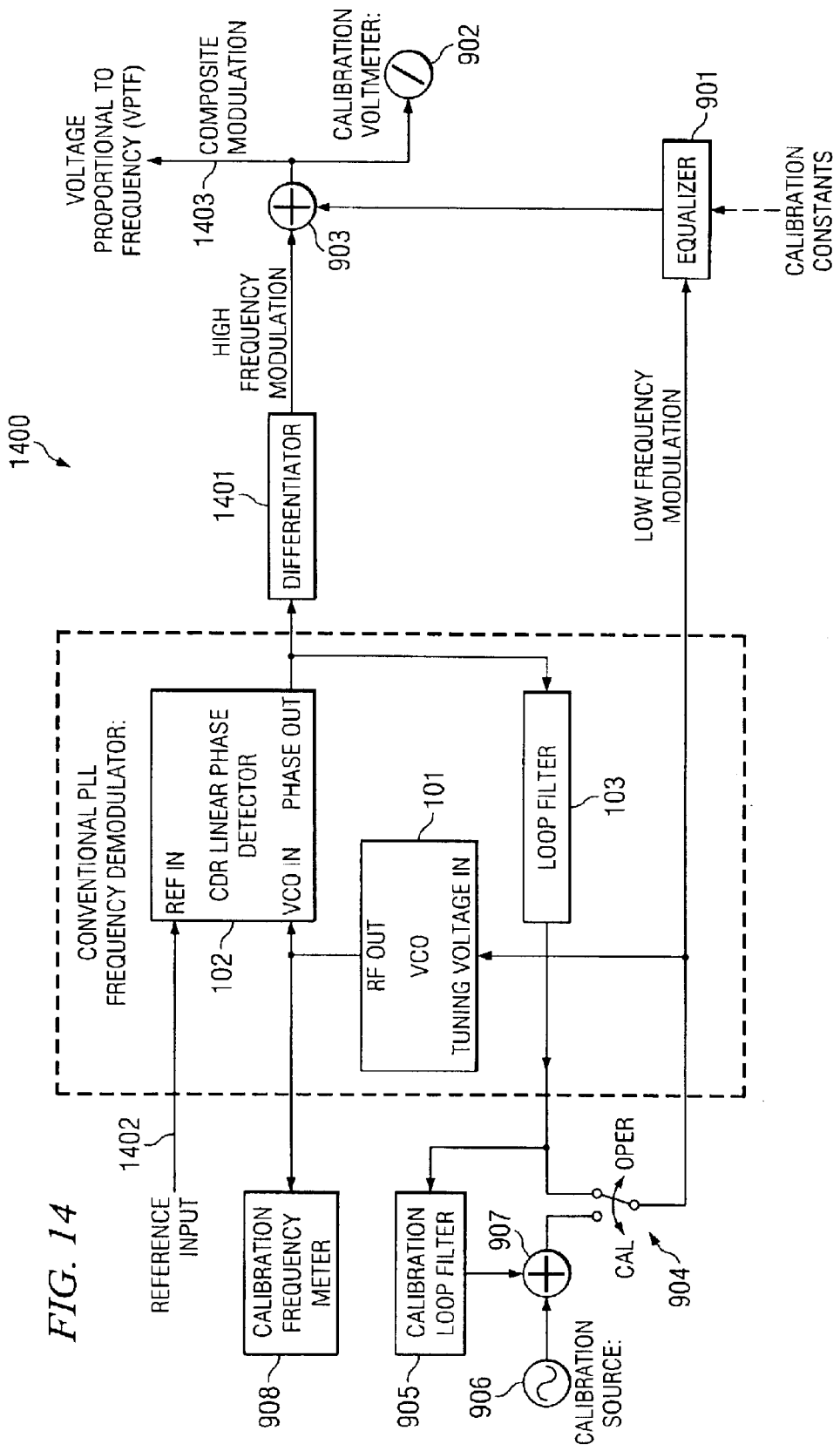
FIG. 14 depicts a frequency demodulator according to embodiments in accordance with the invention.

As previously noted, phase demodulators may be converted to frequency demodulators by employing a differentiator circuit element. However, it is preferred to avoid cascading leaky integrator 801 with the differentiator circuit element. Therefore, it is advantageous to place the differentiator 1401 before adder 903 and to omit leaky integrator 801 as shown in frequency demodulator 1400 in FIG. 14 according to embodiments in accordance with the invention. By implementing frequency demodulator 1400 in this manner, frequency demodulator 1400 demodulates frequency-modulated reference signal 1402 as demodulated signal 1403. Moreover, frequency demodulator 1400 shares the advantageous characteristics previously described with respect to phase demodulators implemented according to embodiments in accordance with the invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps describe the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A phase locked loop (PLL) phase demodulator that produces a demodulated signal, comprising:
    an integrator that receives a filtered phase signal of a PLL to produce an integrated signal;
    an equalizer that equalizes said integrated signal; and
    an adder that combines a phase signal of said PLL with said equalized integrated signal to produce said demodulated signal.

2. The PLL phase demodulator of claim 1 wherein said equalizer is a low pass filter that emulates a modulation response curve associated with said PLL.

3. The PLL phase demodulator of claim 1 wherein said equalizer causes a demodulation gain of said PLL demodulator to equal a phase detector gain of the PLL.

4. The PLL phase demodulator of claim 1 wherein said integrator integrates above a minimum frequency and provides approximately flat gain versus frequency below said minimum frequency.

5. The PLL phase demodulator of claim 1 further comprising:
    a calibration filter that further filters said filtered phase signal to provide an output signal to a second adder, wherein said second adder combines said output signal and a reference signal to produce a combined signal; and
    a switch that supplies said filtered phase signal to said integrator in a first mode and supplies said combined signal to said integrator in a second mode.

6. The PLL phase demodulator of claim 5 wherein said calibration filter is a low pass filter that is operable to reduce loop bandwidth of said PLL when said switch operates in said second mode.

7. The PLL phase demodulator of claim 5 further comprising:
    a calibration source that is operable to supply said reference signal to said second adder.

8. A frequency demodulator that produces a demodulated signal, comprising:
    an equalizer that equalizes a filtered phase signal of a phase locked loop (PLL) according to a transfer function that approximates a modulation response curve associated with said PLL to produce an equalized signal;
    a differentiator that differentiates a phase signal of said PLL to produce a differentiated signal; and
    an adder that combines said differentiated signal with said equalized signal to produce said demodulated signal.

9. The frequency demodulator of claim 8 wherein said equalizer causes demodulation gain of said frequency demodulator to equal a time derivative of a phase detector gain of the PLL.

10. The frequency demodulator of claim 8 further comprising:
    a calibration filter that further filters said filtered phase signal to provide an output signal to a second adder, wherein said second adder combines said output signal and a reference signal to produce a combined signal; and
    a switch that supplies said filtered phase signal to said equalizer in a first mode and supplies said combined signal to said integrator in a second mode.

11. The frequency demodulator of claim 10 wherein said calibration filter is a low pass filter that is operable to reduce loop bandwidth of said PLL in said second mode.

12. The frequency demodulator of claim 10 further comprising:
    a calibration source that is operable to supply said reference signal to said second adder.

13. A method of performing frequency demodulation, comprising:
    operating a phase locked loop (PLL) utilizing a filtered phase signal;
    equalizing said filtered phase signal according to a transfer function that approximates a modulation response curve associated with said PLL to produce an equalized signal; and combining said equalized signal with a differentiated version of a phase signal of said PLL to produce a demodulated signal.

14. The method of claim 13, wherein said equalizing said filtered phase signal occurs in a first mode of operation of said PLL frequency demodulator and calibration of said PLL frequency demodulator occurs in a second mode of operation of said PLL frequency demodulator.

15. The method of claim 13, wherein said PLL frequency demodulator is being operated in said second mode, said method further comprising:

low pass filtering said filtered phase signal to reduce loop-bandwidth of said PLL;

combining an output signal from said low pass filter with a reference signal to produce a combined signal;

equalizing said combined signal according to said transfer function to produce a second equalized signal; and combining said second equalized signal and said differentiated version of said phase signal to produce a calibration signal.

16. The method of claim 15 wherein said reference signal is a single frequency signal.

17. A method of performing phase demodulation, comprising:

operating a phase locked loop (PLL) utilizing a filtered phase signal;

integrating said filtered phase signal to generate an integrated signal;

equalizing said integrated signal according to a transfer function that approximates a modulation response curve associated with said PLL to produce an equalized signal; and combining said equalized signal and a phase signal of said PLL to produce a demodulated signal.

18. The method of claim 17, wherein said integrating said filtered phase signal occurs in a first mode of operation of said PLL phase demodulator and calibration of said PLL phase demodulator occurs in a second mode of operation of said PLL phase demodulator.

19. The method of claim 18, wherein said PLL phase demodulator is being operated in said second mode, said method further comprising:

low pass filtering said filtered phase signal to generate an output signal and to reduce loop bandwidth of said PLL;

combining said output signal with a reference signal to produce a combined signal;

integrating said combined signal;

equalizing said integrated combined signal according to said transfer function to produce a second equalized signal; and combining said second equalized signal and said phase signal to produce a calibration signal.

20. The method of claim 19 wherein said reference signal is a single frequency signal.

* * * * *